US011405048B2

(12) United States Patent
 Chen

(10) Patent No.: US 11,405,048 B2
(45) Date of Patent: Aug. 2, 2022

(54) SIGMA DELTA MODULATOR DEVICE AND SIGMA DELTA MODULATION METHOD

(71) Applicant: REALTEK SEMICONDUCTOR CORPORATION, Hsinchu (TW)

(72) Inventor: Wen-Tze Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/238,470

(22) Filed: Apr. 23, 2021

(65) Prior Publication Data

US 2021/0359700 A1    Nov. 18, 2021

(30) Foreign Application Priority Data

May 13, 2020   (TW) ................................. 109115835

(51) Int. Cl.
  *H03M 3/00*   (2006.01)
  *H03M 1/34*   (2006.01)
  *H03M 1/66*   (2006.01)

(52) U.S. Cl.
  CPC .............. *H03M 3/39* (2013.01); *H03M 1/34* (2013.01); *H03M 1/662* (2013.01); *H03M 3/496* (2013.01)

(58) Field of Classification Search
  CPC .......... H03M 3/39; H03M 1/34; H03M 1/662; H03M 3/496; H03M 3/464; H03M 3/424
 (Continued)

(56) References Cited

U.S. PATENT DOCUMENTS

| 7,492,296 B1 * | 2/2009 | Drakshapalli | H03M 3/35 |
| | | | 341/172 |
| 7,538,705 B2 | 5/2009 | Deval et al. | |

(Continued)

OTHER PUBLICATIONS

OA letter of the counterpart TW application (appl. No. 109115835) dated Jul. 30, 2020. Summary of the OA letter: 1. Claims 1, 2, 8, and 9 are rejected as allegedly being anticipated by the cited reference 1 (U.S. Pat. No. 9444489 B2). 2. Claim 7 is rejected as allegedly being unpatentable over the cited reference 1. 3. Claims 4, 5, and 10 are rejected as allegedly being unpatentable over the cited reference 1 in view of the cited reference 2 (U.S. Pat. No. 7538705 B2). 4. Claims 3 and 6 are allowable.

(Continued)

*Primary Examiner* — Khai M Nguyen
(74) *Attorney, Agent, or Firm* — WPAT, PC

(57) ABSTRACT

A sigma delta modulator device includes a sampling circuit, a digital to analog converter circuit, an integrator circuit, and an analog to digital converter circuit. The sampling circuit is configured to sample an input signal, in order to generate a first signal. The digital to analog converter circuit is configured to convert a first digital signal to be a combination of a first reference voltage and a common mode voltage, in order to generate a second signal, in which the first reference voltage is one of a positive reference voltage and a negative reference voltage. The integrator circuit is configured to perform integration according to the first signal and the second signal, in order to generate a third signal. The analog to digital converter circuit is configured to quantize the third signal to generate an output signal, and to generate the first digital signal according to the output signal.

14 Claims, 3 Drawing Sheets

(58) Field of Classification Search
USPC .......................................................... 341/143
See application file for complete search history.

(56) References Cited

U.S. PATENT DOCUMENTS

| | | | |
|---|---|---|---|
| 8,009,077 B1 * | 8/2011 | Melanson | H03M 3/368 |
| | | | 341/143 |
| 9,281,837 B2 * | 3/2016 | Nezuka | H03M 3/368 |
| 9,378,184 B2 * | 6/2016 | Han | G06F 17/10 |
| 9,444,489 B2 | 9/2016 | Roh et al. | |
| 10,735,016 B2 * | 8/2020 | Nakamura | H03M 3/30 |

OTHER PUBLICATIONS

K. Lee, M. R. Miller and G. C. Temes, "An 8.1 mW, 82 dB Delta-Sigma ADC With 1.9 MHz BW and -98 dB THD," in IEEE Journal of Solid-State Circuits, vol. 44, No. 8, pp. 2202-2211, Aug. 2009, doi: 10.1109/JSSC.2009.2022298.

* cited by examiner

SIGMA DELTA MODULATOR DEVICE AND SIGMA DELTA MODULATION METHOD

BACKGROUND

1. Technical Field

The present disclosure relates to a sigma delta modulator. More particularly, the present disclosure relates to a sigma delta modulator device and method that are able to reduce redundant current in a digital to analog converter circuit and an integrator circuit.

2. Description of Related Art

In current sigma delta modulators, a digital to analog converter circuit sets multiple reference voltages according to a digital signal generated from a quantizer circuit, in order to generate a corresponding analog voltage. However, in most cases, redundant reference voltage utilized in the conversion progress will cause unnecessary load current, and thus the power consumption of overall system is increased.

SUMMARY

In some embodiments, a sigma delta modulator device includes a sampling circuit, a digital to analog converter circuit, an integrator circuit, and an analog to digital converter circuit. The sampling circuit is configured to sample an input signal, in order to generate a first signal. The digital to analog converter circuit is configured to convert a first digital signal to be a combination of a first reference voltage and a common mode voltage, in order to generate a second signal, in which the first reference voltage is one of a positive reference voltage and a negative reference voltage. The integrator circuit is configured to perform integration according to the first signal and the second signal, in order to generate a third signal. The analog to digital converter circuit is configured to quantize the third signal to generate an output signal, and to generate the first digital signal according to the output signal.

In some embodiments, a sigma delta modulation method includes the following operations: sampling an input signal, in order to generate a first signal; converting a first digital signal to be a combination of a first reference voltage and a common mode voltage, in order to generate a second signal, in which the first reference voltage is one of a positive reference voltage and a negative reference voltage; performing integration according to the first signal and the second signal, in order to generate a third signal; and quantizing the third signal to generate an output signal, and to generate the first digital signal according to the output signal.

These and other objectives of the present disclosure will no doubt become obvious to those of ordinary skill in the art after reading the following detailed description of the embodiments that are illustrated in the various figures and drawings.

DETAILED DESCRIPTION

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with at least one circuit, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
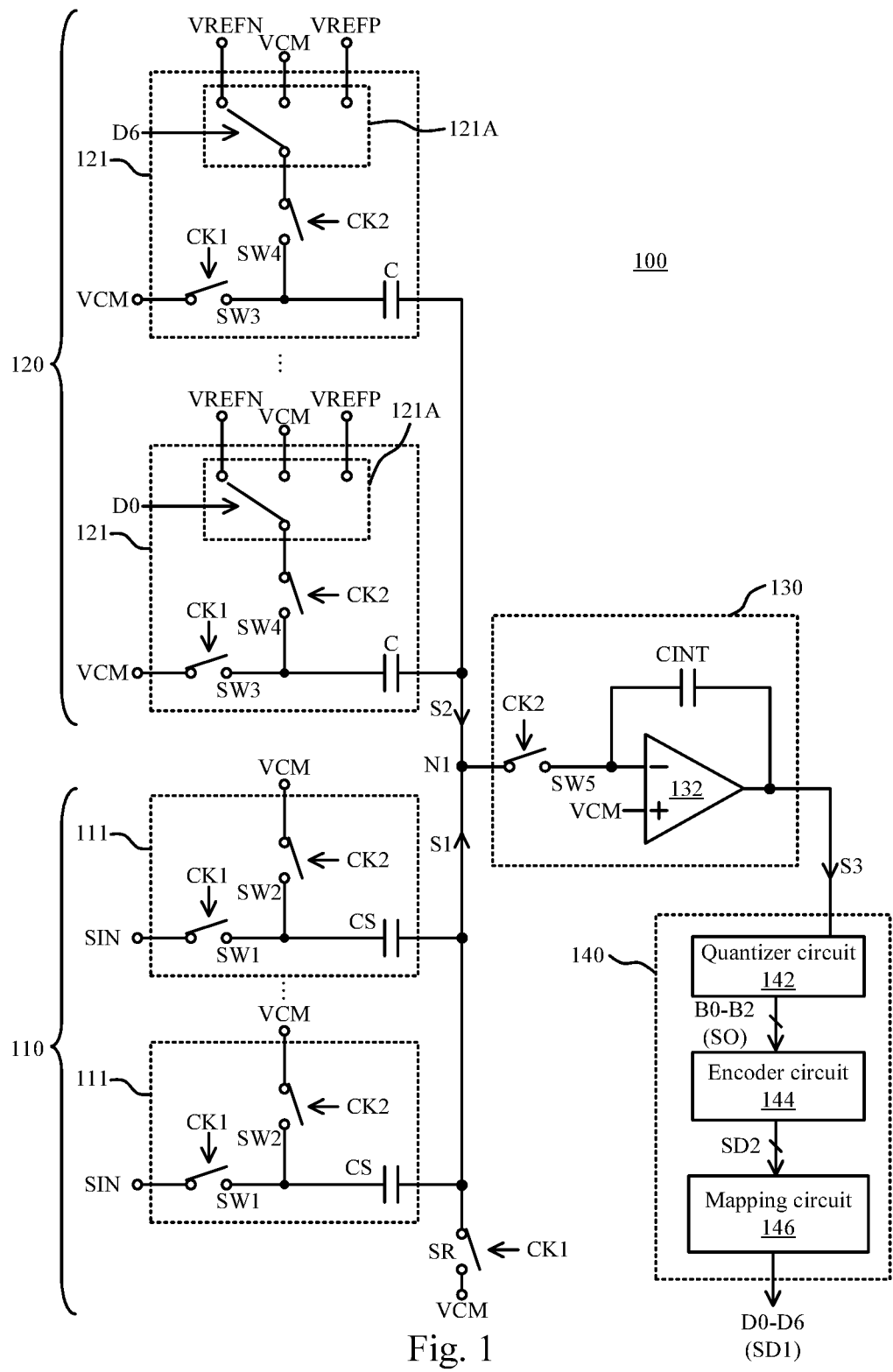
FIG. 1 is a schematic diagram of a sigma delta modulator device according to some embodiments of the present disclosure.

FIG. 1 is a schematic diagram of a sigma delta modulator device 100 according to some embodiments of the present disclosure. The sigma delta modulator device 100 generates an output signal SO according to an input signal SIN. In some embodiments, the sigma delta modulator device 100 includes a sampling circuit 110, a digital to analog converter (DAC) circuit 120, an integrator circuit 130, and an analog to digital converter (ADC) circuit 140.

The sampling circuit 110 samples the input signal SIN to generate a signal S1. For example, the sampling circuit 110 includes switching circuits 111 and a reset switch SR. The reset switch SR is coupled between a node N1 and a node for receiving a common voltage VCM. Each switching circuit 111 includes a switch SW1, a switch SW2, and a sampling capacitor CS. A first terminal of the sampling capacitor CS is coupled to the switch SW1 and the switch SW2, and a second terminal of the sampling capacitor CS is coupled to the node N1. During a sampling phase, the switch SW1 and the reset switch SR are turned on (i.e., being closed or providing free passage of electrical signals) according to a clock signal CK1, and the switch SW2 is not turned on (i.e., being open or providing blockage of electrical signals) according to a clock signal CK2. As a result, a voltage difference between the input signal SIN and the common voltage VCM is stored in the sampling capacitor CS. During an integration phase, the switch SW2 is turned on according to the clock signal CK2, and the switch SW1 and the reset switch SR are not turned on according to the clock signal CK1. As a result, the sampling capacitors CS convert the stored voltage differences to the signal S1.

The DAC circuit 120 converts a digital signal SD1 to a signal S2. In some embodiments, the DAC circuit 120 converts the digital signal SD1 to be a combination of a first reference voltage and the common voltage VCM, in order to generate the signal S2, in which the first reference voltage is one of a positive reference voltage VREFP and a negative reference voltage VREFN. In some embodiments, the common voltage VCM is an altering current (AC) ground voltage. In some embodiments, the common voltage VCM is an average voltage of the positive reference voltage VREFP and the negative reference voltage VREFN. In some embodiments, the positive reference voltage VREFP can be expressed as VCM+VREF, the negative reference voltage VREFN can be expressed as VCM-VREF, in which VREF is a reference signal swing.

In this example, the DAC circuit 120 includes switching circuits 121. Each switching circuit 121 includes a capacitor C, a switch SW3, a switch SW4, and a multiplexer circuit 121A. In some embodiments, the capacitance value of the capacitor C may be the same as that of the sampling capacitor CS. In some embodiments, a number of the switching circuits 121 is the same as that of the switching circuits 111. A first terminal of the switch SW3 receives the common voltage VCM, and a second terminal of the switch SW3 is coupled to a first terminal of the capacitor C. A second terminal of the capacitor C is coupled to the node N1. The switch SW3 is turned on according to the clock signal CK1, in order to transmit the common voltage VCM to the capacitor C. In other words, during the sampling phase, the level on the first terminal of the capacitor C and the level on the second terminal (i.e., the node N1) of the capacitor C are reset to the common voltage VCM respectively through the switch SW3 and the reset switch SR.

A first terminal of the switch SW4 is coupled to the multiplexer circuit 121A, in order to receive a positive reference voltage VREFP, a negative reference voltage VREFN, or a common voltage VCM from the multiplexer circuit 121A. A second terminal of the switch SW4 is coupled to a first terminal of the capacitor C. During an integration phase, the switch SW4 is turned on according to the clock signal CK2, in order to transmit the positive reference voltage VREFP, the negative reference voltage VREFN, or the common voltage VCM to the capacitor C from a corresponding multiplexer circuit 121A. As a result, during the integration phase, the capacitors C2 generate the signal S2 according to the received voltages and transmit the same to the node N1. During the integration phase, if the capacitor C receives the common voltage VCM, levels on two terminals of the capacitor C are the same, and thus no charges are transferred by this capacitor C (i.e., the capacitor C does not generate a dynamic current). Alternatively, if the capacitor C receives the first reference voltage (e.g., the positive reference voltage VREFP or the negative reference voltage VREFN), charges in the capacitor C are redistributed to generate the corresponding signal S2, and to transmit the same to an integration capacitor CINT.

Each of the multiplexer circuits 121A receives a corresponding one bit of the digital signal SD1. For example, the digital signal SD1 includes seven bits D0-D6. A first multiplexer circuit 121A receives the first bit D0. A second multiplexer circuit 121A receives the second bit D1. With this analogy, a seventh multiplexer circuit 121A receives the seventh bit D6. The multiplexer circuit 121A may transmit the positive reference voltage VREFP, the negative reference voltage VREFN, or the common voltage VCM to the switch SW4 according to the corresponding bit in the digital signal SD1. Operations about the digital to analog conversions of the DAC circuit 120 are described with reference to FIG. 2.

The integrator circuit 130 is configured to perform integration according to the signal S1 and the signal S2, in order to generate a signal S3. For example, the integrator circuit 130 includes a switch SW5, the integration capacitor CINT, and an amplifier circuit 132. A first terminal of the switch SW5 is coupled between the node N1 and a first terminal (e.g., negative input terminal) of the amplifier circuit 132. A second terminal (e.g., positive input terminal) of the amplifier circuit 132 receives the common voltage VCM. The integration capacitor CINT is coupled between the first input terminal and an output terminal of the amplifier circuit 132. During the integration phase, the switch SW5 is turned on according to the clock signal CK2, and the switch SW1 is not turned on according to the clock signal CK1. Under this condition, signals stored in the capacitors C and the sampling capacitors CS that are coupled to the node N1 are transmitted to the first input terminal of the amplifier circuit 132 and the integration capacitor CINT. As described above, the signal S1 corresponds to the voltage difference (SIN-VCM) sampled by the sampling capacitors CS, and the signal S2 is generated by the capacitors C according to the digital signal SD1, and the received first reference voltage or the common voltage VCM. As a result, during the integration phase, an amount of charges corresponding to the difference between the signal S2 and the input signal SIN is transferred from the sampling circuit 110 and the DAC circuit 120 to the integration capacitor CINT. The difference between the signal S2 and the input signal SIN can be integrated by the amplifier circuit 132 with the integration capacitor CINT, in order to generate the signal S3.

The ADC circuit 140 is configured to quantize the signal S3 to generate the output signal SO, and to generate the digital signal SD1 according to the output signal SO. For example, the ADC circuit 140 includes a quantizer circuit 142, an encoder circuit 144, and a mapping circuit 146. The quantizer circuit 142 quantizes the signal S3 to generate the output signal SO. In some embodiments, the quantizer circuit 142 may be (but not limited to) a comparator circuit. The encoder circuit 144 is configured to encode the output signal SO to be a digital signal SD2. For example, the output signal SO includes three bits B0-B2, which are a binary code. The encoder circuit 144 encodes the output signal SO to generate the digital signal SD2 having seven bits, in which these bits are thermometer code. The mapping circuit 146 maps the digital signal SD2 into the digital signal SD1. In some embodiments, the mapping circuit 146 may include a look up table that stores the relation shown in FIG. 2, in order to output the digital signal SD1 according to the digital signal SD2.

Figure 2:
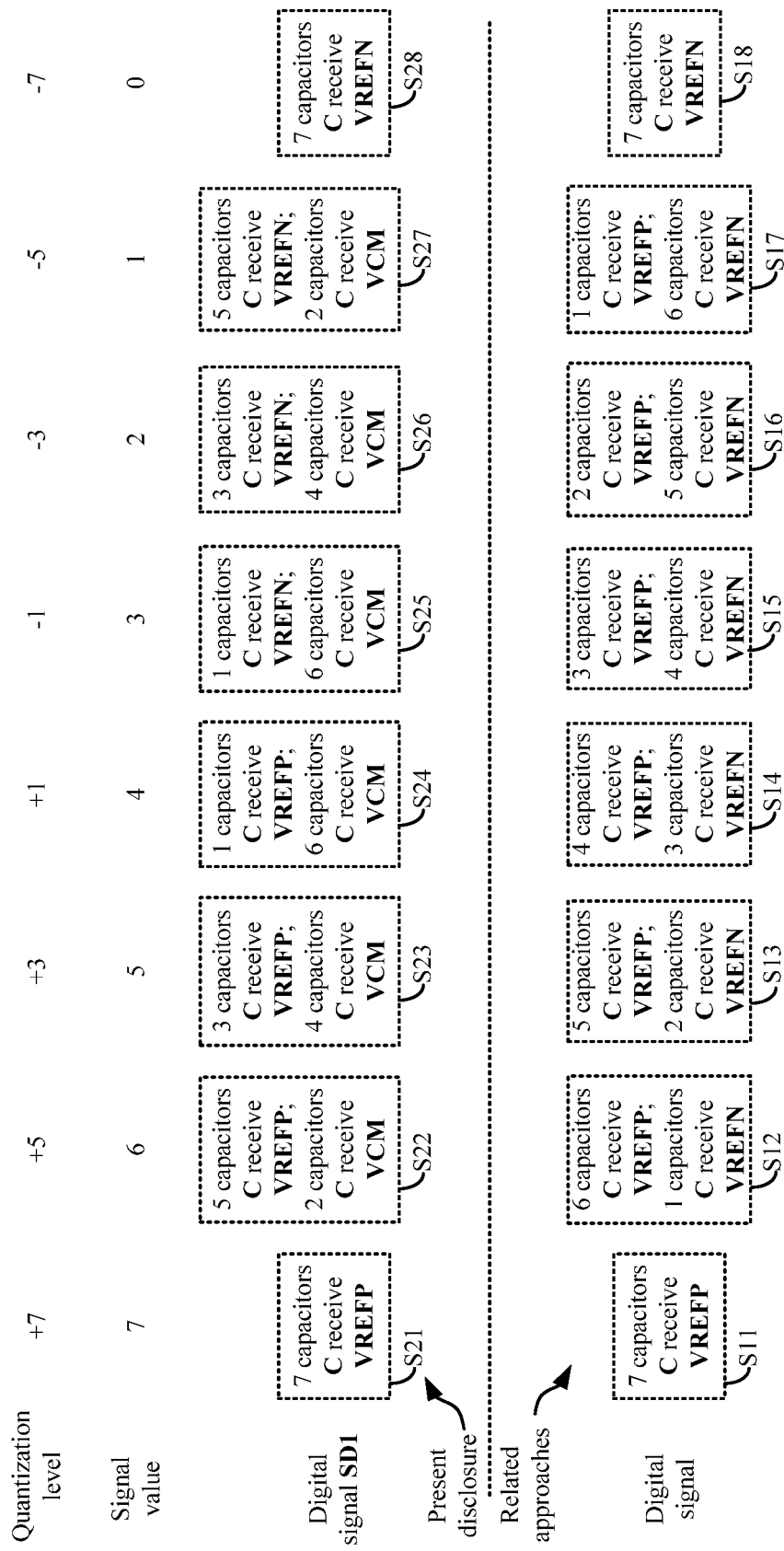
FIG. 2 is a schematic diagram showing operations of the mapping circuit in FIG. 1 according to some embodiments of the present disclosure.

FIG. 2 is a schematic diagram showing operations of the mapping circuit 146 in FIG. 1 according to some embodiments of the present disclosure. For ease of understanding, operations (e.g., steps S21-S28) of the DAC circuit 120 are also illustrated. In this example, the output signal SO is set to have three bits, and the digital signal SD2 encoded from the output signal SO is set to have seven bits. As shown in FIG. 2, the quantizer circuit 142 is able to quantize the output signal SO to be quantization levels of +7, +5, +3, ..., −3, −5, and −7. Each quantization level corresponds to one signal value. For example, the quantization levels of +7, +5, +3, ..., −3, −5, and −7 respectively correspond to signal values of 7, 6, 5, 4, ..., 1, and 0. The signal value can be expressed by three bits B0-B2 of the output signal SO. For example, if the bits B0-B2 are "010," the output signal SO corresponds to the signal value of 2. Alternatively, if the bits B0-B2 are "101," the output signal SO corresponds to the signal value of 5.

In this example, an analog voltage represented by an unity of quantization level D is a sum of the common mode voltage VCM and the D/7 times of the reference signal swing VREF (which can be expressed as VCM+D×VREF/7), in which the common voltage VCM is zero volt in this example. For example, if the bits B0-B2 are "010," the output signal SO corresponds to the quantization level of −3, and it indicates that the analog voltage corresponding to the output signal SO is −3/7 times of the reference signal swing VREF. Under this condition, the DAC circuit 120 outputs the signal S2 being the same as a triple negative reference voltage VREFN. Equivalently, the output signal SO is converted to a corresponding analog voltage (i.e., the signal S2) by the DAC circuit 120. In some related approaches, a DAC circuit is configured to convert a digital signal to be a combination of the positive reference voltage VREFP and the negative reference voltage VREFN (e.g., steps S11-S18). For example, in these approaches, if three bits in the digital signal is "010," two capacitors (e.g., capacitor C) in the DAC circuit receive the positive reference voltage VREFP, and five capacitors receive the negative reference voltage VREFN (i.e., step S16). As a result, by combining two positive reference voltages VREFP and five negative reference voltages VREFN, the DAC circuit is able to generate an analog voltage which is equivalent to the triple reference voltages VREFN, in order to express −3/7 times of the reference signal swing VREF. As described above, if the capacitor C receives the positive reference voltage VREFP or the negative reference voltage VREFN, charges in the capacitor C will be transferred, and thus a dynamic current consumption is caused. Moreover, in these approaches, as charges will be transferred in each capacitor C, an effective capacitance value of the node N1 will be increased, which results in a lower feedback factor and lower bandwidth of an integrator circuit. In order to compensate the speed of the integrator circuit, a driving current of the integrator circuit is required to be higher. As a result, the power consumption of the sigma delta modulator will be increased significantly.

Compared to the above approaches, in this example, the bits B0-B2 are "010," the mapping circuit 146 generates the corresponding digital signal SD1 according to a relation among the first reference voltage, the common voltage VCM, and the quantization level corresponding to the output signal SO. In response to this digital signal SD1, three capacitors C receive the negative reference voltage VREFN and the remaining capacitors C receive the common voltage VCM, in order to generate the signal S2 corresponding to the triple negative reference voltage VREFN (i.e., step S26). In other words, the mapping circuit 146 may generate the digital signal SD1 according to the quantization level corresponding to the output signal SO, such that a corresponding number of capacitors C receive the first reference voltage (e.g., the positive reference voltage VREFP or the negative reference voltage VREFN), and that the remaining capacitors C receive the common voltage VCM. For example, if the output signal SO corresponds to the quantization level of −5, five capacitors C receive the negative reference voltage VREFN, and the remaining capacitors C receive the common voltage VCM. If the output signal SO corresponds to the quantization level of +3, three capacitors C receive the positive reference voltage VREFP, and the remaining capacitors C receive the common voltage VCM (i.e., step S23). The above corresponding relation can be set and stored in a look up table (not shown), and the mapping circuit 146 is able to search this look up table according to the digital signal SD2, in order to generate the corresponding bits D0-D6 (i.e., the digital signal SD1).

As described above, during the integration phase, if the capacitor C receives the common voltage VCM, the charges in the capacitor C will not be transferred. In other words, with the above mapping, the number of capacitors C that cause dynamic current consumption in the conversion progress can be reduced. Furthermore, as a level on certain parts of the capacitors C will not be varied, the effective capacitance value of the node N1 can be lower. Under this condition, the feedback factor of the integrator circuit 130 can be increased, and thus the driving current of the integrator circuit 130 can be lower. As a result, compared with the above related approaches, the overall power consumption of the sigma delta modulator device 100 can be reduced.

In most cases, a part of the capacitors C receive the first reference voltage (i.e., the positive reference voltage VREFP or the negative reference voltage VREFN), and the remaining part of capacitors C receive the common voltage VCM, in order to reduce current consumption. In some extreme cases, if the output signal SO corresponds to a highest quantization level (e.g., +7) or a lowest quantization level (e.g., −7), all of the capacitor C receive the positive reference voltage VREFP or the negative reference voltage VREFN (i.e., step S21 or step S28). Numbers of components or numbers of bits in FIG. 1 and/or FIG. 2 are given for illustrative purposes, and the present disclosure is not limited thereto.

Figure 3:
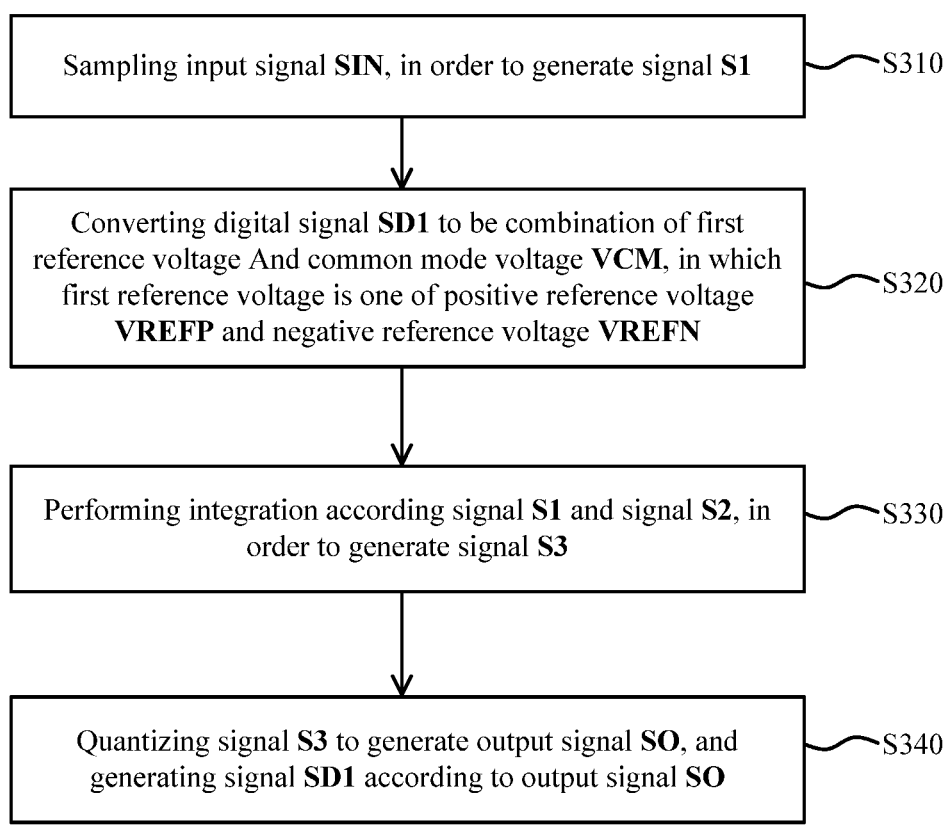
FIG. 3 is a flow chart of a sigma delta modulation method according to some embodiments of the present disclosure.

FIG. 3 is a flow chart of a sigma delta modulation method 300 according to some embodiments of the present disclosure. In operation S310, the input signal SIN is sampled to generate the signal S1. In operation S320, the digital signal SD1 is converted to a combination of the first reference voltage and the common voltage VCM, in order to generate the signal S2, in which the first reference voltage is one of the positive reference voltage VREFP and the negative reference voltage VREFN. In operation S330, integration is performed according to the signal S1 and the signal S2, in order to generate the signal S3. In operation S340, the signal S3 is quantized to generate the output signal SO, and the digital signal SD1 is generated according to the output signal SO.

The above description of the sigma delta modulation method 300 includes exemplary operations, but the operations of the sigma delta modulation method 300 are not necessarily performed in the order described above. Operations of the sigma delta modulation method 300 can be added, replaced, changed order, and/or eliminated, or the operations of the sigma delta modulation method 300 can be executed simultaneously or partially simultaneously as appropriate, in accordance with the spirit and scope of various embodiments of the present disclosure.

As described above, the sigma delta modulator device and the sigma delta modulation method provided in some embodiments of the present disclosure can control the DAC circuit to receive the common mode voltage according to the quantization level corresponding to the output signal, in order to perform the digital to analog conversion. As a result, the power consumption of overall system can be reduced.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A sigma delta modulator device, comprising:
   a sampling circuit configured to sample an input signal, in order to generate a first signal;
   a digital to analog converter circuit configured to utilize a plurality of capacitors to convert a first digital signal to be a combination of a first reference voltage and a common mode voltage, in order to generate a second signal, wherein the first reference voltage is one of a positive reference voltage and a negative reference voltage, and a plurality of terminals of each of the plurality of capacitors are configured to receive the common mode voltage during the sampling circuit samples the input signal;
   an integrator circuit configured to perform integration according to the first signal and the second signal, in order to generate a third signal; and
   an analog to digital converter circuit configured to quantize the third signal to generate an output signal, and to generate the first digital signal according to the output signal.

2. The sigma delta modulator device of claim 1, wherein the digital to analog converter circuit comprises the plurality of capacitors, and each of the capacitors is configured to receive the first reference voltage or the common mode voltage according to a corresponding bit of the first digital signal, in order to generate the second signal.

3. The sigma delta modulator device of claim 1, wherein the digital to analog converter circuit comprises a plurality of switching circuits, and each of the plurality of switching circuits comprises:
   a corresponding capacitor in the plurality of capacitors;
   a first switch configured to be turned on according to a first clock signal, in order to transmit the common mode voltage to the corresponding capacitor;
   a second switch configured to be turned on according to a second clock signal, in order to transmit the first reference voltage or the common mode voltage to the corresponding capacitor; and
   a multiplexer circuit configured to transmit the first reference voltage or the common mode voltage to the second switch according to a corresponding bit of the first digital signal.

4. The sigma delta modulator device of claim 1, wherein the analog to digital converter circuit comprises:
   a quantizer circuit configured to quantize the third signal to generate the output signal;
   an encoder circuit configured to encode the output signal to generate a second output signal; and
   a mapping circuit configured to map the second digital signal into the first digital signal.

5. The sigma delta modulator device of claim 4, wherein the output signal is a binary code, and the second digital signal is a thermometer code.

6. The sigma delta modulator device of claim 4, wherein the mapping circuit is configured to map the second digital signal into the first digital signal according to a relation among the first reference voltage, the common mode voltage, and a quantization level corresponding to the output signal.

7. The sigma delta modulator device of claim 1, wherein the common mode voltage is an average voltage of the positive reference voltage and the negative reference voltage.

8. A sigma delta modulation method comprising:
   sampling an input signal, in order to generate a first signal;
   utilizing a plurality of capacitors to convert a first digital signal to be a combination of a first reference voltage and a common mode voltage, in order to generate a second signal, wherein the first reference voltage is one of a positive reference voltage and a negative reference voltage, and a plurality of terminals of each of the plurality of capacitors are configured to receive the common mode voltage when the input signal is being sampled;
   performing integration according to the first signal and the second signal, in order to generate a third signal; and
   quantizing the third signal to generate an output signal, and to generate the first digital signal according to the output signal.

9. The sigma delta modulation method of claim 8, wherein utilizing the plurality of capacitors to convert the first digital signal to be the combination of the first reference voltage and the common mode voltage, in order to generate the second signal comprises:
   transmitting the first reference voltage or the common mode voltage to a corresponding capacitor in the plurality of capacitors according to a corresponding bit of the first digital signal, in order to generate the second signal.

10. The sigma delta modulation method of claim 8, wherein quantizing the third signal to generate the output signal, and to generate the first digital signal according to the output signal comprises:
   quantizing the third signal to generate the output signal;
   encoding the output signal to generate a second output signal; and
   mapping the second digital signal into the first digital signal.

11. The sigma delta modulation method of claim 10, wherein the output signal is a binary code, and the second digital signal is a thermometer code.

12. The sigma delta modulation method of claim 10, wherein mapping the second digital signal into the first digital signal comprises:
   mapping the second digital signal into the first digital signal according to a relation among the first reference voltage, the common mode voltage, and a quantization level corresponding to the output signal.

13. The sigma delta modulation method of claim 8, wherein utilizing the plurality of capacitors to convert the first digital signal to be the combination of the first reference voltage and the common mode voltage, in order to generate the second signal comprises:
- turning on a first switch according to a first clock signal, in order to transmit the common mode voltage to a corresponding capacitor in the plurality of capacitors;
- turning on a second switch according to a second clock signal, in order to transmit the first reference voltage or the common mode voltage to the corresponding capacitor; and
- transmitting, by a multiplexer circuit, the first reference voltage or the common mode voltage to the second switch according to a corresponding bit of the first digital signal.

14. The sigma delta modulation method of claim 8, wherein the common mode voltage is an average voltage of the positive reference voltage and the negative reference voltage.

* * * * *